US008933763B2

(12) United States Patent
Fast

(10) Patent No.: US 8,933,763 B2
(45) Date of Patent: Jan. 13, 2015

(54) MEANDERED SLOW WAVE TAPER MATCHING NETWORK

(71) Applicant: Raytheon Company, Waltham, MA (US)

(72) Inventor: Bryan Fast, Garland, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/714,718

(22) Filed: Dec. 14, 2012

(65) Prior Publication Data

US 2014/0167876 A1    Jun. 19, 2014

(51) Int. Cl.
*H03H 7/38* (2006.01)
*G06F 17/50* (2006.01)
*H01P 3/08* (2006.01)

(52) U.S. Cl.
CPC ............. *H03H 7/38* (2013.01); *G06F 17/5072* (2013.01); *H01P 3/08* (2013.01); *G06F 17/5063* (2013.01)
USPC .............................................. 333/34; 333/33

(58) Field of Classification Search
USPC ..................................... 333/34, 33
See application file for complete search history.

(56) References Cited

U.S. PATENT DOCUMENTS 1,926,807 A    9/1933 Hansell
3,419,813 A    12/1968 Kamnitsis

OTHER PUBLICATIONS

Klopfenstein; "A Transmission Line Taper of Improved Design;" Proceedings of the IRE; vol. 44; Issue 1; Jan. 1956; pp. 31-35.
"Klopfenstein Taper—Microwave Encyclopedia", on website http://www.microwave101.com/encyclopedia/Klopfenstein.cfm, 10 pages, May 30, 2012.
Klopfenstein; "A Transimission Line Taper of Improved Design;" Proceedings of the IRE; vol. 39; No. 1; Jan. 1, 1965; pp. 31-15.
Lestari, et, al.; "Bent Tapered Microstrip Balun Transformer;" IEEE Microwave Conference; APMC; Dec. 7, 2009; pp. 2156-2159.
Nesic, et al.; "A New Small Size Wideband Impedance Transfer;" Telsiks 2005; Servia and Montenegro, Nis; Sep. 28-30, 2005; pp. 163-166.
PCT Search Report of the ISA for PCT/US2013/038356 dated Jul. 12, 2013.
Written Opinion of the ISA for PCT/US2013/038356 dated Jul. 12, 2013.
Khalaj-Amirhosseini; Wideband or Mutliband Complex Impedance Matching Using Microstrip Nonuniform Transmission Lines; Progress in Electromagnetics Research; PIER 66; 15-25, 2006; pp. 15-25.

*Primary Examiner* — Stephen E Jones
(74) *Attorney, Agent, or Firm* — Daly, Crowley, Mofford & Durkee, LLP

(57) ABSTRACT

Presently disclosed is a matching network provided from a slow wave, wrapped, tapered-transformer transmission line.

9 Claims, 2 Drawing Sheets

MEANDERED SLOW WAVE TAPER MATCHING NETWORK

FIELD

The concepts, systems, circuits, devices and techniques described herein relate generally to radio frequency (RF) circuits and more particularly to RF matching circuits.

BACKGROUND

As is known in the art, impedance matching of radio frequency (RF) circuits and systems is the practice of matching en impedance of one or more ports of a first RF circuit or system to the impedance of one or more ports of a second RF circuit or system to ideally maximize the power transfer or minimize reflections from the ports. For example, it is desirable to match an RF amplifier output impedance to en input impedance of another RE component coupled to the RF amplifier output for the purpose of maximizing power transfer between the RF amplifier and the subsequent RF component.

As is also known, a properly designed transmission line may perform the function of an impedance matching network. One type of transmission line having an impedance matching taper is described by R. W. Klopfenstein in a paper titled "A Transmission Line Taper of Improved Design," published in the Proceedings of the IRE, page 31-35, January 1956.

Transmission lines provided having a taper in accordance with the aforementioned paper are commonly referred to as "Klopfenstein transmission line tapers" or as "Dolph-Tchebycheff transmission line tapers." Such transmission line tapers are optimum in the sense that ideally, they provide minimum reflection coefficient magnitudes in a pass band for a specified length of taper. Similarly, for a specified maximum magnitude reflection coefficient in the pass band, an ideal Dolph-Tchebycheff transmission line taper (a/k/a Klopfenstein taper) has a minimum length.

Referring now to FIG. 1, an exemplary transmission line 10 has a first end 10a and a second end 10b and a conventional Klopfenstein transmission line taper extending from the first end to the second end. Such Klopfenstein transmission lines are found in a variety of different RF systems, circuit and devices.

Following the Klopfenstein's technique, the transmission line 10 presents an impedance transformation that closely follows the real axis of a Smith chart. Impedance matching required in practical applications, however, usually contains a reactive component. Thus, deviations from the Klopfenstein equations allow one to transform complex impedances represented on the Smith chart in regions away from the real axis.

FIG. 2 shows one such deviation known in the prior art, where experimentally stretching/shrinking the width and length of a transmission line (e.g. transmission line 10 in FIG. 1) at random locations 22a-22e results in a transmission line 20 having a first end 20a and a second end 20b. It should be noted transmission line 20 includes regions 22a-22e used to shorten the transmission line length and optimize the transmission line for a complex impedance match as is generally known.

While the Klopfenstein transmission line taper (a/k/a the Dolph-Tchebycheff taper) provides good electrical performance characteristics, in certain applications, it is sometimes desirable (or even necessary) to use a matching circuit having a length which is shorter than that provided by a conventional Klopfenstein transmission line taper. At the same time, it is desirable to use a matching circuit having electrical performance characteristics which are substantially the same as those provided by a conventional Klopfenstein transmission line taper.

SUMMARY

In accordance with the concepts, systems, circuits, devices and techniques described herein, an impedance matching network (also sometimes referred to herein simply as a "matching network") is provided from a slow wave, wrapped, tapered-transformer transmission line in a novel, compact structure achieved by using a combination of meandering and slow waving techniques. This approach makes the matching network useable in spaces and applications where use of such matching networks was previously not practical due to the inability to provide certain circuit performance characteristics due to size limitations. A matching network provided in accordance with the concepts and techniques described herein, however, enables circuits to be made smaller without sacrificing circuit performance.

In one embodiment, an impedance matching network comprises a slow wave, wrapped, Klopfenstein tapered-transformer transmission line. With this particular arrangement, an impedance matching network which is more compact than conventional impedance matching networks while at the same time providing the substantially the same or improved performance characteristics is provided. The use of both a meandered layout technique and a slow wave technique results in a compact impedance matching network. The impedance matching network can be made even more compact by folding or wrapping the line. In one embodiment, an impedance matching network provided as a slow wave, wrapped, Klopfenstein tapered-transformer transmission line is suitable for use in a monolithic microwave integrated circuit (MMIC).

In one embodiment, the impedance matching network employs conductors having the widest possible width to thereby reduce loss and achieves phase inversions (to account for the reactive component of the complex impedance transform) by varying the impedance of the transmission line. Because the phase inversions are kept to such a low level of loss, they can be applied more times, thus improving the quality of impedance match across the same bandwidth.

In one embodiment, slow-wave techniques are applied and the impedance matching network layout is folded or wrapped to provide a compact folded layout. Ideally the compact folded layout has an insertion loss characteristic which is substantially the same as an insertion loss characteristic on an unfolded layout. The result is a low-loss matching network that can achieve any bandwidth desired, and significantly, fit on an integrated circuit such as a MMIC (also sometimes referred to herein simply as a "chip").

In accordance with a further aspect of the concepts, circuits, systems and techniques described herein, a method for designing an impedance matching network includes: (a) designing a first Klopfenstein tapered-transformer transmission line to match a first impedance characteristic to a second different impedance characteristic, (b) applying a slow-wave technique to the first Klopfenstein tapered-transformer transmission line to provide a second tapered-transformer transmission line to match the first impedance characteristic to the second different impedance characteristic and (c) folding (or wrapping) the second tapered-transformer transmission line to provide a slow wave, wrapped, Klopfenstein tapered-transformer transmission line.

With this particular arrangement, a technique for providing a compact impedance matching network is described. Application of this technique allows implementation of a compact meandered slow wave taper matching network on a MMIC in a space which heretofore was too small to allow implementation of an impedance matching network having similar electrical performance characteristics.

In one embodiment, the first tapered-transformer transmission line is provided having a first insertion loss characteristic and the second tapered-transformer transmission line has an insertion loss characteristic which is substantially the same as the first insertion loss characteristic.

In one embodiment, the second tapered-transformer transmission line design is more compact than the first tapered-transformer transmission line.

In one embodiment, a software program may be used to fold second tapered-transformer transmission line (or compute a series of bends in the second tapered-transformer transmission line design to provide a slow wave, wrapped, Klopfenstein tapered-transformer transmission line.

While it is recognized that impedance matching using a Klopfenstein taper is a frequently used technique, the application of both a meandered layout technique and a slow wave technique which allows actual implementation of a meandered slow wave taper matching network has never before been done.

In accordance with a still further aspect of the concepts described herein, an impedance matching network having a first port and a second port comprises a slow wave, wrapped, tapered-transformer transmission line to match a first impedance characteristic at a first port of the impedance matching network to a second different impedance characteristic at a second port of the impedance matching network.

With this particular arrangement, a compact impedance matching network is provided. In one embodiment, the tapered-transformer transmission line is provided having a Klopfenstein taper to provide the tapered-transformer transmission line as a Klopfenstein tapered-transformer transmission line. In one embodiment, the Klopfenstein tapered-transformer transmission line is disposed on a substrate which may, for example, correspond to the substrate of an integrated circuit (IC) or the substrate of a monolithic microwave integrated circuit (MMIC).

In one embodiment, the slow wave, wrapped, tapered-transformer transmission line is provided having a transmission line width corresponding to a widest possible width for a given geometry and the slow wave, wrapped, tapered-transformer transmission line is provided having varying widths corresponding to varying impedances along the length of the slow wave, wrapped, tapered-transformer transmission line.

In accordance with a still further aspect of the concepts described herein, a computer-readable medium having stored thereon a computer program executable by one or more processors, comprises computer instructions for: (a) designing a first Klopfenstein tapered-transformer transmission line to match a first impedance characteristic to a second different impedance characteristic, (b) applying a slow-wave technique to the first Klopfenstein tapered-transformer transmission line to provide a second tapered-transformer transmission line to match the first impedance characteristic to the second different impedance characteristic and (c) folding (or wrapping) the second tapered-transformer transmission line to provide a slow wave, wrapped, Klopfenstein tapered-transformer transmission line.

With this particular arrangement, a processor controlled system for providing compact impedance matching networks is provided. Such a system is used in the design of impedance matching networks provided from a slow wave, wrapped, Klopfenstein tapered-transformer transmission line.

It should be noted that this Summary is provided to introduce a selection of concepts in a simplified form that are further described below in the Detailed Description. This Summary is not intended to identify key features or essential features of the claimed subject matter, nor is it intended to be used to limit the scope of the claimed subject matter and should not be so construed.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Described herein is an impedance matching network also sometimes referred to herein simply as "a matching network" or even more simply as "a network." The impedance matching network is provided as a slow wave, tapered-transformer transmission line which provides an impedance matching function. In some embodiments, the impedance matching network is provided as a slow wave, tapered-transformer transmission line which is also "wrapped" so as to occupy a relatively small amount of space (e.g. a relatively small amount of space on a substrate, for example). In particular, a slow wave, wrapped, tapered-transformer transmission line adapted to fit in a compact space, such as (but not limited to) that afforded on an integrated circuit such as a monolithic microwave integrated circuit (MMIC) or other stripline/microstrip RF circuit implementations known in the art is described.

It should, however, be appreciated that although reference is sometimes made herein to implementation of a slow wave, wrapped, tapered-transformer transmission line in an integrated circuit such as a MMIC (sometimes also referred to herein simply as a "chip"), such description is intended as exemplary and references made herein to any specific circuit implementations are only provided to promote clarity in describing the concepts, structures and techniques being disclosed. It should thus be appreciated that the impedance matching networks and techniques described herein are not limited to any particular type of RF circuit, RF application. Rather, the impedance matching networks described herein find use in a wide variety of radio frequency (RF) systems, circuits and devices.

Figure 3:
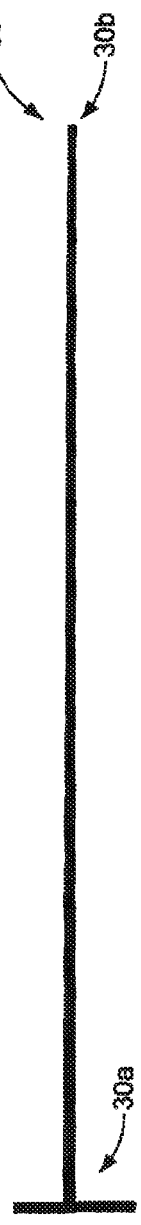
FIG. 3 is a diagram of an impedance matching network implemented as a transmission line having a Klopfenstein taper and a slow-wave structure to reduce the physical area required for the impedance matching network.
Figure 4:
FIG. 4 is an impedance matching network provided from a slow wave, wrapped, tapered-transformer transmission line.

Further in the exemplary embodiment described herein in conjunction with FIGS. 3, 4 the network performs matching between a lower impedance one on the wider side, and a higher one on the narrower side. As to frequencies, the goal is to provide wide bandwidths and the rule follows that wider bandwidths matched are inversely proportional to the quality of the reflection characteristics.

For example, in one exemplary embodiment, the network may be employed as the output matching network of a power amplifier. However, as noted above, the goal of the network is to work as a transformer, and match different real axis impedances with the added benefit of some reactive matching as well.

It should also be appreciated that the slow wave, wrapped, tapered-transformer transmission line and related techniques described herein are not limited to implementation on or with any particular type of RF transmission media and that the slow wave, wrapped, tapered-transformer transmission line may be implemented in a variety of different RF transmission media including, but not limited to: microstrip, stripline, coplanar waveguide, suspended air stripline.

It should thus be appreciated and understood that the impedance matching network and techniques described herein may be utilized in a wide variety of different RF applications.

Figure 1:
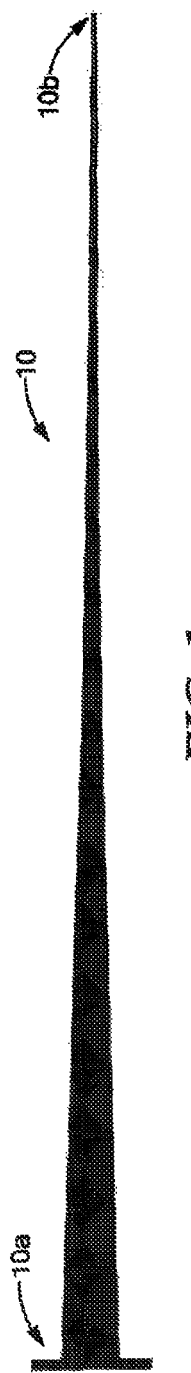
FIG. 1 is a diagram of a prior art impedance matching network implemented as a transmission line having a Klopfenstein impedance taper.

Generally speaking, impedance matching circuits or networks having a relatively long taper, despite narrowed widths (e.g. as shown in FIG. 1), do not fit well onto a circuit, substrate, or MMIC having a limited aspect ratio (length-to-width ratio) or otherwise constrained real estate limitations. Furthermore, and as noted above, while transmission lines having a conventional Klopfenstein taper provide an efficient impedance transformation of real impedances, it is much less adaptable for use where a complex impedance transformation (i.e., one having both real and reactive components) is needed.

In preferred embodiments, the network presently disclosed employs the transmission lines (or transmission line section or regions) having widths which are as wide as possible so as to reduce insertion loss and achieve phase inversions (to account for the reactive component of the complex impedance transform) by varying the impedance of the transmission line. Because the phase inversions are kept to such a low level of loss, they can be applied more times, thus improving the quality of impedance match across the same bandwidth.

Furthermore, in some embodiments and as will become apparent from the description hereinbelow, the layout of the network may be folded (or wrapped) and slow-wave techniques may be used to further compact the layout. The result is a matching network having an insertion loss characteristic which is relatively low compared with insertion loss characteristics of conventional matching networks and that can achieve any bandwidth desired. Significantly, matching networks provided in accordance with the techniques described herein fit on an integrated circuit such as a monolithic microwave integrated circuit (MMIC).

Figure 2:
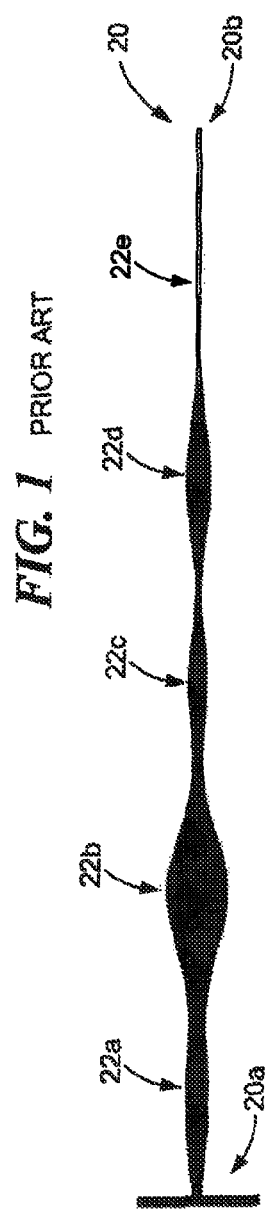
FIG. 2 is a diagram of a prior art impedance matching network implemented as a transmission line optimized for matching complex impedances.

Referring now to FIG. 3, a slow wave, tapered-transformer transmission line 30 having first and second ends 30a, 30b is provided by applying a slow-waving technique to a transmission line such as transmission line 20 shown and described above in conjunction with FIG. 2. The slow-waving technique is employed to add additional shunt capacitance to transmission line 20 (FIG. 2). Slow-waving (i.e., deliberately slowing the EM propagation in the transmission line by varying the dielectric parameters, such as by, but not limited to, inserting additional shunt capacitance) lowers the impedance relative to the Klopfenstein taper (illustrated in FIG. 1) while preserving the impedance transformation.

As can be seen by observing transmission line 30 shown in FIG. 3, the added capacitance from the slow-waving technique allows for a narrowing of the line while maintaining the impedance characteristic. The same widths/lengths are not maintained. However, for a given transmission media (e.g. a given substrate having a given thickness and a given relative dielectric constant), there is a relationship between the width of the transmission line and the insertion loss characteristic of the transmission line. Specifically, the narrower the line width, the higher the insertion loss characteristic. Consequently, if the transmission line becomes too narrow, the transmission is provided having an undesirably high insertion loss characteristic. Thus, slow-waving techniques are only applied to the wider sections of the target taper (such as in regions 22a-22d illustrated in FIG. 2). It should be appreciated that any slow-waving technique known to those of ordinary skill in the art may be used to provide a complex impedance transformation.

Referring now to FIG. 4, a slow wave, tapered-transformer transmission line (e.g., such as slow wave, tapered-transformer transmission line 30) has been folded or wrapped to provide a slow wave, wrapped tapered-transformer transmission line 40.

Folding (or wrapping) slow wave, tapered-transformer transmission line reduces the footprint of the impedance matching network without degrading electrical performance characteristics thus resulting in an impedance matching network suitable for use taper into a practical, on-chip solution. Such an implementation may be accomplished by first designing a Klopfenstein tapered-transformer transmission line to match the input impedance to the real component of the output impedance. Next, the Klopfenstein tapered design must be adapted to account for the complex component of the output impedance. This is necessary because the real impedance transform from the input to the output of the Klopfenstein tapered-transfomer transmission line design must be further transformed to account for the desired complex transformation required. It should be appreciated that a trade-off between size, loss, and match quality is made to determine an appropriate by which to shrink any given circuit and the relative importance of factors being considered may vary from application to application.

The second transformation, from the real to the complex, may be accomplished (in one exemplary embodiment) by applying a slow-wave technique to the Klopfenstein tapered tapered-transformer transmission line design, the resulting tapered tapered-transformer transmission line design is more compact than the original Klopfenstein tapered tapered-transformer transmission line design by virtue of the slow-waving technique. Also, the resulting tapered tapered-transformer transmission line design has an insertion loss characteristic that is substantially the same as the original Klopfenstein tapered tapered-transformer transmission line design insertion loss characteristic.

Folding the layout of the resulting tapered-transformer transmission line design creates a meandering tapered-transformer transmission line that fits within desired boundaries of a circuit such as an integrated circuit or MMIC. This meandered tapered-transformer transmission line is referred to herein as a slow wave, wrapped, Klopfenstein tapered-transformer transmission line.

The particular process for folding (or meandering) the tapered tapered-transformer transmission line layout is dependent upon the chip space (real estate) available and the required entry and exit point locations on the chip. In the example, it was important that the entry point be centered vertically. Given the desired, pre-determined entry and exit points on the chip, a series of 90 and 180° turns are made (typically using computer-aided design (CAD) tools or the like) to fill the designated real estate as much as possible. A reasonable gap must be maintained between the folded segments of the tapered tapered-transformer transmission line to prevent the signal from coupling across the gaps. Likewise, the length of the wrap sections needs to be short enough to reduce (or ideally eliminate) mutual coupling between the parallel line sections of the tapered-transformer transmission line. Preferably, the electrical path length of each corner is computed (using conventional modeling and simulation tools appropriate to tapered-transformer transmission line design) to ensure that the correct lengths and widths are maintained in the tapered-transformer transmission line.

In one embodiment, impedance matching circuit 40 is provided as a slow wave, wrapped, Klopfenstein tapered-transformer transmission line having transmission line widths corresponding to the widest transmission lines possible for a given geometry.

It should, however, be noted that the slow wave, wrapped, Klopfenstein tapered-transformer transmission line may have varying widths corresponding to varying impedances along its length to provide an output matching network having phase inversions. Each time there is a phase inversion, a set of frequency responses gets circled around the same match point. The more times this is done, the more frequencies are pulled to the same impedance thereby providing improved bandwidth.

Figure 5:
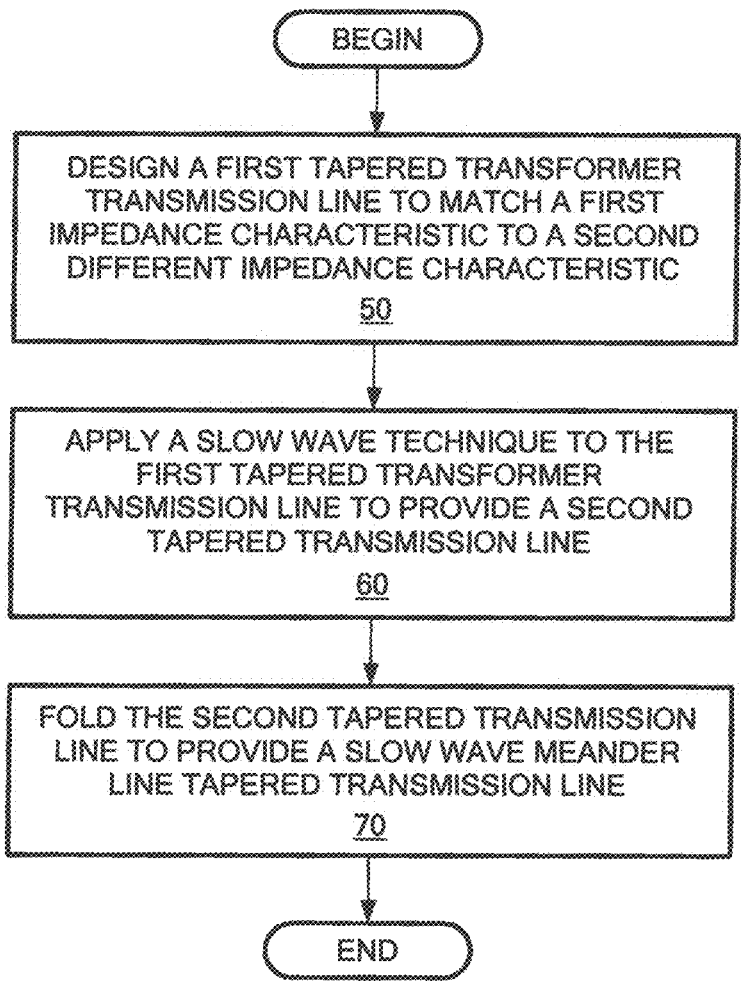
FIG. 5 is a flow diagram of a process for providing an impedance matching network provided from a slow wave, wrapped, tapered-transformer transmission line.

FIG. 5 is a flow diagram which describes a technique for providing an impedance matching network provided as a slow wave, wrapped, tapered-transfomer transmission line. The technique begins as shown in block 50 in which a first tapered-transformer transmission line is designed to match a first impedance characteristic at the first port of the impedance matching network to a second different impedance characteristic at the second port of the impedance matching network, the first tapered-transformer transmission line having a first insertion loss characteristic. In preferred embodiments, the first tapered-transformer transmission line is provided having a Klopfenstein taper.

Processing then proceeds to processing block 60 in which a slow-wave technique is applied to the first tapered-transformer transmission line design to provide a second transmission line transformer to match the first impedance characteristic to the second different impedance characteristic. The second transmission line transformer design is more compact than the first transmission line transformer design as can be seen, for example, by comparing FIGS. 1, 2 and 3. Significantly, after application of the slow wave technique, the second transmission line transformer has an insertion loss characteristic which is substantially the same as the insertion loss characteristic of the first transmission line transformer.

Processing then proceeds to processing block 70 in which the tapered-transformer transmission line design is wrapped or folded (e.g. as illustrated in FIG. 4) to provide a slow wave, wrapped, transmission line transformer.

In one embodiment, the process is implemented via a computer program, configured to perform the above-described processes including wrapping of the slow-waved Klopfenstein taper to fit within a pre-defined boundary.

The order in which the steps of the present technique are performed is purely illustrative in nature. In fact, the steps can be performed in any order or in parallel, unless otherwise indicated by the present disclosure.

It should also be appreciated that the techniques described herein may be performed in either hardware, software, or any combination thereof, as those terms are currently known in the art. In particular, the present method may be carried out by any non-transitory software, firmware, and/or microcode operating on or stored in a computer or computers of any type. Additionally, software embodying the present invention may comprise computer instructions in any form (e.g., source code, object code, and/or interpreted code, etc.) stored in any non-transitory computer-readable medium (e.g., ROM, RAM, magnetic media, punched tape or card, compact disc (CD), digital versatile disc (DVD), solid state disk (SSD), and/or the like, without limitation). Furthermore, such software may also be in the form of a computer data signal embodied in a carrier wave, such as that representing the well-known Web pages transferred among devices connected to and within a computer network, such as but not limited to the Internet. Accordingly, the present invention is not limited to any particular platform, unless specifically stated otherwise in the present disclosure.

While particular embodiments of the present invention have been shown and described, it will be apparent to those skilled in the art that various changes and modifications in form and details may be made therein without departing from the spirit and scope of the invention as defined by the following claims. Accordingly, the appended claims encompass within their scope all such changes and modifications.

I claim:

1. An impedance matching network having a first port and a second port, the impedance matching network comprising:
 a substrate; and
 a slow wave, wrapped, tapered-transformer transmission line having first and second ends with the first end of the transmission line corresponding to the first port of the impedance matching network and the second end of the transmission line corresponding to the second port of the impedance matching network wherein said slow wave, wrapped, tapered-transformer transmission line is provided to match a first impedance characteristic at the first port of the impedance matching network to a second different impedance characteristic at the second port of the impedance matching network wherein:
 the first and second ports of the impedance matching network are each provided having complex impedance values with the complex impedance value of the first port being lower than the complex impedance value of the second port;
 said slow-wave, wrapped, tapered-transformer transmission line is provided having a length which is less than the length of a tapered-transformer transmission line having the first impedance characteristic at a first port thereof and the second, different impedance characteristic at a second port thereof and having a Klopfenstein impedance taper between the first and second ports;
 said slow wave, wrapped, tapered-transformer transmission line has an insertion loss characteristic that is substantially the same as an insertion loss characteristic of a tapered-transformer transmission line having a Klopfenstein impedance taper along a length thereof between the first and second ports; and
 the dielectric parameters of at least portions of said substrate are varied along the length of the slow wave portions of said transmission line to add additional shunt capacitance such that the width of the transmission line does not increase in a direction moving from the first port to the second port of the transmission line.

2. The impedance matching network of claim 1 wherein said substrate having said Klopfenstein slow wave, wrapped, tapered-transformer transmission line is provided as part of an integrated circuit.

3. The impedance matching network of claim 1 wherein said Klopfenstein slow wave, wrapped, tapered-transformer transmission line is disposed on a substrate of a monolithic microwave integrated circuit (MMIC).

4. The impedance matching network of claim 1 wherein said slow wave, wrapped, tapered-transformer transmission line is provided having a transmission line width corresponding to a widest possible width for a given geometry.

5. A non-transitory, computer-readable medium having stored thereon a computer program executable by one or more processors, the computer program comprising computer instructions for:
(a) designing a first tapered-transformer transmission line to match a first impedance characteristic at the first port of the impedance matching network to a second different impedance characteristic at the second port of the impedance matching network, the first tapered-transformer transmission line having a first insertion loss characteristic and having a Klopfenstein impedance taper between the first and second ports;
(b) varying line widths of the first tapered-transformer transmission line to provide a complex impedance match between the first and second ports of the impedance matching network;
(c) applying a slow-wave technique to the first tapered-transformer transmission line design to provide a second transmission line transformer having a length less than the length of the first tapered transmission line to match the first impedance characteristic to the second different impedance characteristic wherein the second transmission line transformer design is more compact than the first transmission line transformer design and wherein the second transmission line transformer has an insertion loss characteristic which is substantially the same as the first insertion loss characteristic;
(d) varying dielectric parameters of at least portions of a substrate on which a first tapered-transformer transmission line will be disposed along the length of the slow wave portions of the transmission line to add additional shunt capacitance such that the width of the transmission line does not increase in a direction moving from the first port to the second port of the transmission line; and
(e) folding the transmission line transformer design to provide a slow wave, wrapped, transmission line transformer.

6. The computer-readable medium of claim 5 wherein applying a slow-wave technique to the first tapered-transformer transmission line comprises applying a slow-wave technique to the first Klopfenstein tapered-transformer transmission line to provide a second Klopfenstein tapered-transformer transmission line to match a first complex impedance characteristic to a second different complex impedance characteristic wherein the second Klopfenstein tapered-transformer transmission line is more compact than the first Klopfenstein tapered-transformer transmission line and wherein the second Klopfenstein tapered-transformer transmission line has an insertion loss characteristic which is substantially the same as the first insertion loss characteristic.

7. The computer-readable medium of claim 6 wherein the first and second impedance characteristics are complex impedance characteristics.

8. A method of designing an impedance matching network having first and second ports and having a relatively low insertion loss characteristic, the method comprising:
(a) designing a first tapered-transformer transmission line to match a first impedance characteristic at the first port of the impedance matching network to a second different impedance characteristic at the second port of the impedance matching network, the first tapered-transformer transmission line having a first insertion loss characteristic and having a Klopfenstein impedance taper between the first and second ports;
(b) varying line widths of the first tapered-transformer transmission line to provide a complex impedance match between the first and second ports of the impedance matching network;
(c) applying a slow-wave technique to the first tapered-transformer transmission line design to provide a second transmission line transformer having a length less than the length of the first tapered transmission line to match a first complex impedance characteristic to a second different complex impedance characteristic wherein the second transmission line transformer design is more compact than the first transmission line transformer design and wherein the second transmission line transformer has an insertion loss characteristic which is substantially the same as the first insertion loss characteristic;
(d) varying dielectric parameters of at least portions of a substrate on which a first tapered-transformer transmission line will be disposed along the length of the slow wave portions of the transmission line to add additional shunt capacitance such that the width of the transmission line does not increase in a direction moving from the first port to the second port of the transmission line; and
(e) folding the transmission line transformer design to provide a slow wave, wrapped, transmission line transformer.

9. The method of claim 8 wherein applying a slow-wave technique to the first tapered-transformer transmission line comprises applying a slow-wave technique to the first Klopfenstein tapered-transformer transmission line to provide a second Klopfenstein tapered-transformer transmission line to match a first complex impedance characteristic to a second, different complex impedance characteristic wherein the second Klopfenstein tapered-transformer transmission line is more compact than the first Klopfenstein tapered-transformer transmission line and wherein the second Klopfenstein tapered-transformer transmission line has an insertion loss characteristic which is substantially the same as the first insertion loss characteristic.

* * * * *